United States Patent
Makifuchi et al.

(10) Patent No.: US 9,922,822 B2
(45) Date of Patent: Mar. 20, 2018

(54) SILICON CARBIDE SEMICONDUCTOR DEVICE AND MANUFACTURING METHOD OF SILICON CARBIDE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Youichi Makifuchi, Tsukuba (JP); Takashi Tsutsumi, Tsukuba (JP); Tsuyoshi Araoka, Tsukuba (JP); Mitsuo Okamoto, Tsukuba (JP); Kenji Fukuda, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 14/991,887

(22) Filed: Jan. 8, 2016

(65) Prior Publication Data
US 2016/0126092 A1    May 5, 2016

Related U.S. Application Data

(63) Continuation of application No. PCT/JP2014/068353, filed on Jul. 9, 2014.

(30) Foreign Application Priority Data

Jul. 11, 2013 (JP) ................................. 2013-145927

(51) Int. Cl.
*H01L 29/15* (2006.01)
*H01L 21/02* (2006.01)
(Continued)

(52) U.S. Cl.
CPC ...... *H01L 21/02337* (2013.01); *H01L 21/049* (2013.01); *H01L 29/1608* (2013.01);
(Continued)

(58) Field of Classification Search
CPC ........... H01L 21/02337; H01L 29/1608; H01L 29/51
(Continued)

(56) References Cited

U.S. PATENT DOCUMENTS

| 6,482,704 B1 | 11/2002 | Amano et al. |
| 6,764,963 B2 * | 7/2004 | Fukuda .................. H01L 21/049 257/E21.063 |

(Continued)

FOREIGN PATENT DOCUMENTS

| DE | 19612692 C1 | 11/1997 |
| EP | 1434272 A1 | 6/2004 |

(Continued)

OTHER PUBLICATIONS

Lai P. T. et al., "Effects of nitridation and annealing on interface properties of thermally oxidized SiO2/SiC metal-oxide-semiconductor system", Applied Physics Letters, vol. 76, No. 25, Jun. 19, 2000.

*Primary Examiner* — Vu A Vu
(74) *Attorney, Agent, or Firm* — Rabin & Berdo, P.C.

(57) ABSTRACT

On a silicon carbide semiconductor substrate, heat treatment is performed after one layer or two or more layers of an oxide film, a nitride film, or an oxynitride film are formed as a gate insulating film. The heat treatment after the gate insulating film is formed is performed for a given period in an atmosphere that includes $H_2$ and $H_2O$ without including $O_2$. As a result, hydrogen or hydroxyl groups can be segregated in a limited region that includes the interface of the silicon carbide substrate and the gate insulating film. The width of the region to which the hydrogen or hydroxyl (Continued)

groups is segregated is from 0.5 nm to 10 nm. In such a manner, the interface state density can be lowered and high channel mobility can be realized.

20 Claims, 7 Drawing Sheets

(51) Int. Cl.
    *H01L 29/78*     (2006.01)
    *H01L 29/16*     (2006.01)
    *H01L 21/04*     (2006.01)
    *H01L 29/51*     (2006.01)
    *H01L 29/94*     (2006.01)

(52) U.S. Cl.
    CPC ............ *H01L 29/51* (2013.01); *H01L 29/518* (2013.01); *H01L 29/78* (2013.01); *H01L 29/94* (2013.01)

(58) Field of Classification Search
    USPC .......................................................... 257/77
    See application file for complete search history.

(56) References Cited

U.S. PATENT DOCUMENTS

| | | | |
|---|---|---|---|
| 6,936,550 B2 * | 8/2005 | Yamamoto | H01L 21/28079 257/E21.194 |
| 8,133,787 B2 * | 3/2012 | Endo | H01L 21/049 257/E29.257 |
| 2005/0245034 A1 | 11/2005 | Fukuda et al. | |
| 2008/0203400 A1 | 8/2008 | Fukuda et al. | |
| 2009/0072244 A1 | 3/2009 | Harada et al. | |
| 2012/0235165 A1 | 9/2012 | Harada et al. | |

FOREIGN PATENT DOCUMENTS

| | | |
|---|---|---|
| JP | H09-199497 A | 7/1997 |
| JP | 2000-072405 A | 3/2000 |
| JP | 2001-210637 A | 8/2001 |
| JP | 2006-269641 A | 10/2006 |
| JP | 2007-242744 A | 9/2007 |
| JP | 4374437 B | 12/2009 |
| JP | 2011-199132 A | 10/2011 |
| JP | 2012-186490 A | 9/2012 |
| WO | WO-2004/003989 A1 | 1/2004 |

* cited by examiner

SILICON CARBIDE SEMICONDUCTOR DEVICE AND MANUFACTURING METHOD OF SILICON CARBIDE SEMICONDUCTOR DEVICE

CROSS REFERENCE TO RELATED APPLICATIONS

This is a continuation application of International Application PCT/JP2014/068353 filed on Jul. 9, 2014 which claims priority from a Japanese Patent Application No. 2013-145927 filed on Jul. 11, 2013, the contents of which are incorporated herein by reference.

BACKGROUND OF THE INVENTION

1. Field of the Invention

The present invention relates to a silicon carbide semiconductor device that uses a silicon carbide substrate and a manufacturing method of the silicon carbide semiconductor device; and particularly relates to a silicon carbide semiconductor device that can reduce interface state density and a manufacturing method of the silicon carbide semiconductor device.

2. Description of the Related Art

Research and development of next generation semiconductor devices that use a silicon carbide (SiC) substrate are advancing. Although silicon carbide can form an insulating film by thermal oxidation like silicon, silicon carbide has a characteristic in that differences in channel mobility near the junction interface (hereinafter, metal oxide semiconductor (MOS) interface) of the silicon carbide substrate and the gate insulating film forming a MOS gate occur depending on the crystal plane, oxidation method, etc. Oxidation methods of silicon carbide include dry oxidation that uses dry oxygen ($O_2$) as the oxidizing species and wet oxidation that uses water vapor ($H_2O$) as the oxidizing species.

Wet oxidation of a (000-1) surface or a (11-20) surface of a silicon carbide substrate has been shown to have high channel mobility compared to that of a (0001) surface. Interface state density is used as an index to evaluate channel mobility by an alternative means. In general, it is known that the smaller the interface state density is at the MOS gate interface, the greater the channel mobility tends to be.

Related to a manufacturing method of a semiconductor device employing such a silicon carbide substrate, a method of improving a thermally oxidized film of SiC on a silicon carbide substrate has been disclosed that reduces flat-band shifting and hysteresis, and includes a process of annealing by oxygen and a process of annealing by an inert gas, after thermal oxidation of the silicon carbide substrate in oxygen or humidified oxygen (for example, refer to Japanese Laid-Open Patent Publication No. H9-199497).

Further, a method of reducing interface state density by heat treatment in an atmosphere that includes hydrogen ($H_2$) gas has been disclosed, where the heat treatment is performed after oxidizing a (000-1) surface of a silicon carbide substrate in a wet atmosphere of $H_2O$ gas and oxygen gas, or $H_2O$ gas, oxygen gas and an inert gas (for example, refer to Japanese Patent No. 4374437). Although methods of generating the water vapor ($H_2O$) in the wet oxidation include heating pure water, bubbling of pure water by oxygen gas, and the like, at present, pyrogenic schemes using the combustion reaction of $O_2$ gas and $H_2$ gas are common. In such a scheme, the flow ratio of $O_2$ gas and $H_2$ gas is typically rich in $O_2$ since $H_2$ gas in excess has the danger of being explosive. Therefore, the oxidizing atmosphere is an atmosphere of $H_2O+O_2$ of generated $H_2O$ and unreacted $O_2$.

A method of using a platinum catalyst to increase the reactivity of hydrogen and oxygen, causing the reaction to occur at a temperature lower than the ignition temperature of hydrogen mixed gas and generate moisture without high temperature combustion has been disclosed (for example, refer to Japanese Laid-Open Patent Publication No. 2000-72405. In this method, a flow ratio rich in $H_2$ can be used since there is no risk of explosion consequent to the $H_2$ being in excess.

Subjecting a (000-1) surface or a (11-20) surface of a silicon carbide substrate to wet oxidation in gas that includes $H_2O$ and $O_2$, and performing thermal treatment in an atmosphere that includes $H_2$ as hydrogen post oxidation annealing (POA) to reduce the interface state density is said to be for terminating unsaturated bonds (dangling bonds) of silicon atoms on the silicon carbide substrate surface where hydrogen or hydroxyl groups form the interface state.

The interface state density in a case where a (000-1) surface or a (11-20) surface of a silicon carbide substrate is subject to dry oxidation in an atmosphere of only dry oxygen is extremely high and has poor MOS interface characteristics. Further, if hydrogen POA is performed after the dry oxidation, the interface state density is beyond the interface characteristics of wet oxidation and hydrogen POA, which are to reduce interface state density.

Therefore, in gate oxidation for forming a gate insulating film on a (000-1) surface or a (11-20) surface of a silicon carbide substrate, the use of $O_2$ to reduce the interface state density is not effective, whereas the use of $H_2O$ and $H_2$ is effective.

Thus, preferably, hydrogen or hydroxyl groups introduced by gate oxidation and POA are segregated in a small region that includes the MOS interface because unsaturated bonds of silicon atoms on the silicon carbide substrate surface forming the interface state will be efficiently terminated and because hydrogen or hydroxyl groups present in the gate insulating film cause electron traps.

In light of the problems above, one object of the present invention is to effectively reduce the interface state density of a (000-1) surface or a (11-20) surface of a silicon carbide semiconductor.

SUMMARY OF THE INVENTION

To achieve an object, a silicon carbide semiconductor device of the present invention has on a silicon carbide semiconductor substrate, as a gate insulating film, any one among one layer and two or more layers of any one among an oxide film, a nitride film, and an oxynitride film, where hydrogen (H) or hydroxyl groups (OH) are segregated in a region that includes an interface of the silicon carbide semiconductor substrate and a gate insulating film, and a width of the region segregating the hydrogen or hydroxyl groups is from 0.5 nm to 10 nm.

In the region to which hydrogen or hydroxyl groups included in the interface of the silicon carbide semiconductor substrate and the gate insulating film are segregated, $1\times10^{21}$ atoms/cm$^3$ to $1\times10^{22}$ atoms/cm$^3$ of the hydrogen or hydroxyl groups is present.

A manufacturing method of a silicon carbide semiconductor device of the present invention includes heat treatment performed after forming on a silicon carbide semiconductor substrate, as a gate insulating film, any one among one layer and two or more layers of any one among an oxide film, a nitride film, and an oxynitride film, where an atmosphere of the heat treatment after the gate insulating film is formed is a gas atmosphere that includes hydrogen ($H_2$) and water vapor ($H_2O$) without including dry oxygen ($O_2$).

The atmosphere of at least any one among heating and cooling in the heat treatment after the gate insulating film is formed is any one among $H_2$ gas and diluted $H_2$ gas.

Before cooling in the heat treatment after the gate insulating film is formed, the atmosphere is switched to any one among $H_2$ and diluted $H_2$ and maintained for a given period.

After the heat treatment that is performed after the gate insulating film is formed and that is performed in the atmosphere that includes $H_2$ and $H_2O$ without including $O_2$, heat treatment is performed at a given temperature in an atmosphere of any one among $H_2$ gas and diluted $H_2$ gas.

After the heat treatment that is performed after the gate insulating film is formed and that is performed in a gas atmosphere that includes $H_2$ and $H_2O$ and without including $O_2$, heat treatment is performed at a given temperature in an inert gas atmosphere of any among nitrogen, helium, and argon.

Thermal oxidation by a gas that includes $O_2$ without including $H_2O$ is included in forming the gate insulating film.

Thermal oxynitriding in a gas atmosphere that includes at least any one among nitrous oxide and nitric oxide is included in forming the gate insulating film.

Thermal oxidation in a gas atmosphere that includes at least $O_2$ and $H_2O$ is included in forming the gate insulating film.

An insulating film of any one among an oxide film, a nitride film, and, an oxynitride film is deposited in forming the gate insulating film.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Embodiment

Figure 1:
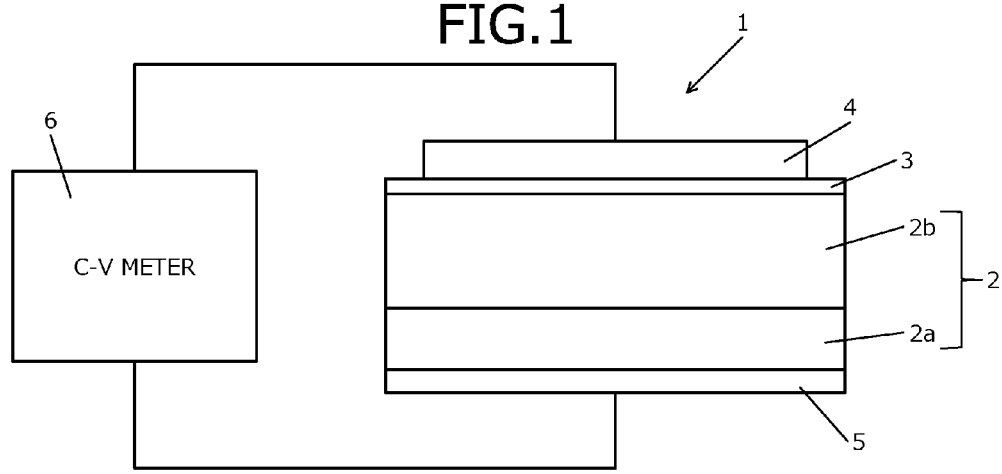
FIG. 1 is a cross sectional view of a silicon carbide semiconductor device according to an embodiment of the present invention.

Preferred embodiments of a silicon carbide semiconductor device and a manufacturing method of the silicon carbide semiconductor device will be described in detail with reference to the accompanying drawings. In the present specification and the accompanying drawings, layers and regions prefixed with n or p mean that majority carriers are electrons or holes. Additionally, + or − appended to n or p means that the impurity concentration is higher or lower, respectively, than layers and regions without + or −. In the present specification, when Miller indices are described, "−" means a bar added to an index immediately after the "−", and a negative index is expressed by prefixing "−" to the index. In the description of the embodiments below and the accompanying drawings, identical constituent elements will be given the same reference numerals and will not repeatedly be described.

FIG. 1 is a cross sectional view of the silicon carbide semiconductor device according to the embodiment of the present invention. FIG. 1 depicts a structure of a MOS capacitor. To verify the extent to which the interface state density is decreased by the present invention, an experiment example using a MOS capacitor will be described. A MOS capacitor 1 depicted in FIG. 1 is manufactured by the following processes.

(1) First Process

First, on an n-type 4H—SiC (000-1) substrate 2a (substrate 0 to 8 degrees off from a (000-1) surface), an n-type epitaxial film 2b of 5 to 10 μm and having a donor density of about $1 \times 10^{16}$ cm$^{-3}$ was grown. The 4H—SiC substrate itself or the 4H—SiC substrate together with the epitaxial film is referred to as "4H—SiC semiconductor 2".

(2) Second Process

After the 4H—SiC semiconductor 2 was cleaned, dry oxidation in a dry oxygen atmosphere of 1100 degrees C. was performed for 50 minutes to form an insulating film 3 of a thickness of 50 nm. Formation of the insulating film 3 may be by thermal oxynitriding via nitric oxide, nitrous oxide, and wet oxidation. Alternatively, the insulating film 3 may be a deposited film. Methods of depositing the insulating film 3 include, but are not limited to, methods using silane or tetraethoxysilane (TEOS) by chemical vapor deposition (CVD).

(3) Third Process

As a POA, heat treatment was performed for 30 minutes at 1000 degrees C. in an atmosphere including 1 standard liter per minute (slm) of $H_2$ and 2 slm of $H_2O$. The atmosphere of the heat treatment reacted 3 slm of $H_2$ and 1 slm of $O_2$ using a platinum catalyst to make the $H_2$ to $O_2$ flow ratio rich in $H_2$, whereby with the reaction $2H_2 + O_2 \rightarrow 2H_2O$, a state without the presence of unreacted $O_2$ was achieved, resulting in an atmosphere of the unreacted 1 slm of $H_2$ and the generated 2 slm of $H_2O$.

The $H_2$ to $O_2$ flow ratio to prevent the presence of unreacted $O_2$ suffices to be $H_2/O_2 = 2$ or greater. Further, dilution by an inert gas such as nitrogen, helium, argon, which do not contributed to the reaction, may be performed.

Heating is performed in a nitrogen atmosphere and cooling is performed in hydrogen atmosphere. Before cooling, a hydrogen atmosphere is maintained for 30 minutes. Both the heating and cooling may be performed in a hydrogen atmosphere or an inert gas atmosphere, or the hydrogen may be diluted by an inert gas. Further, the cooling may be performed in the same atmosphere including $H_2$ and $H_2O$ for the POA, or may be performed in an atmosphere that includes $H_2$ and $H_2O$ diluted by an inert gas.

The film thickness of the insulating film 3 formed at the second process is made thin or the insulating film 3 may be formed by heat treatment performed for a long period in an atmosphere that includes $H_2$ and $H_2O$ until a desired film thickness is achieved, without performing the second process. Further, as a second POA, after the heat treatment in an atmosphere that includes $H_2$ and $H_2O$, heat treatment at 800 to 1200 degrees C. in a hydrogen or inert gas atmosphere may be combined.

Here, as described above, Japanese Laid-Open Patent Publication No. H9-199497 describes performing heat treatment in an inert gas atmosphere/hydrogen atmosphere after thermal oxidation of a silicon carbide substrate in oxygen or humidified oxygen and differs from the POA in an atmosphere that includes $H_2$ and $H_2O$, performed in the third process of the present invention. Further, Japanese Patent No. 4374437 describes performing heat treatment in an atmosphere that includes $H_2$ gas, after thermal oxidation in a mixed gas atmosphere of $H_2O$ gas and oxygen gas, or $H_2O$ gas, oxygen gas and an inert gas and differs from the POA in the atmosphere that includes $H_2$ and $H_2O$, performed in the third process of the present invention. Moreover, Japanese Laid-Open Patent Publication No. 2000-72405 describes that when hydrogen thermal treatment at 1000 degrees C. is performed after silicon carbide is oxidized, the temperature is too high and the oxide film is reduced by the hydrogen, however, reduction of the oxide film at 1000 degrees C. has not been found to occur in the POA in an atmosphere that includes $H_2$ and $H_2O$, performed in the third process of the present invention. The reason for this is thought to be that $H_2O$ is included.

(4) Fourth Process

A dot-shaped aluminum gate electrode 4 is vapor deposited at room temperature on the insulating film 3; aluminum is vapor deposited on the entire back surface to form a back surface aluminum electrode 5; and the MOS capacitor 1 is produced.

The MOS capacitor according to the present invention will be compared to a MOS capacitor of a comparison example, and first to fourth experiment examples directed to interface state density differences will be described. FIGS. 2, 3, 4, and 5 respectively correspond to the first to fourth experiment examples and are graphs depicting interface state densities obtained from measurement results respectively of the MOS capacitor according to the present invention and depicted in FIG. 1 and the MOS capacitor of the comparison example. The horizontal axis represents energy from the conduction band and the vertical axis represents the interface state density.

First Experiment Example

As a first experiment example to verify control effects of the MOS interface according to the present invention, a MOS capacitor was produced without performing the heat treatment in an atmosphere that includes $H_2$ and $H_2O$ according to the third process described above and a MOS capacitor was further produced using hydrogen in the atmosphere of the POA at the third process. The completed MOS capacitors were measured using a C-V meter 6 and interface state densities were calculated and compared.

Figure 2:
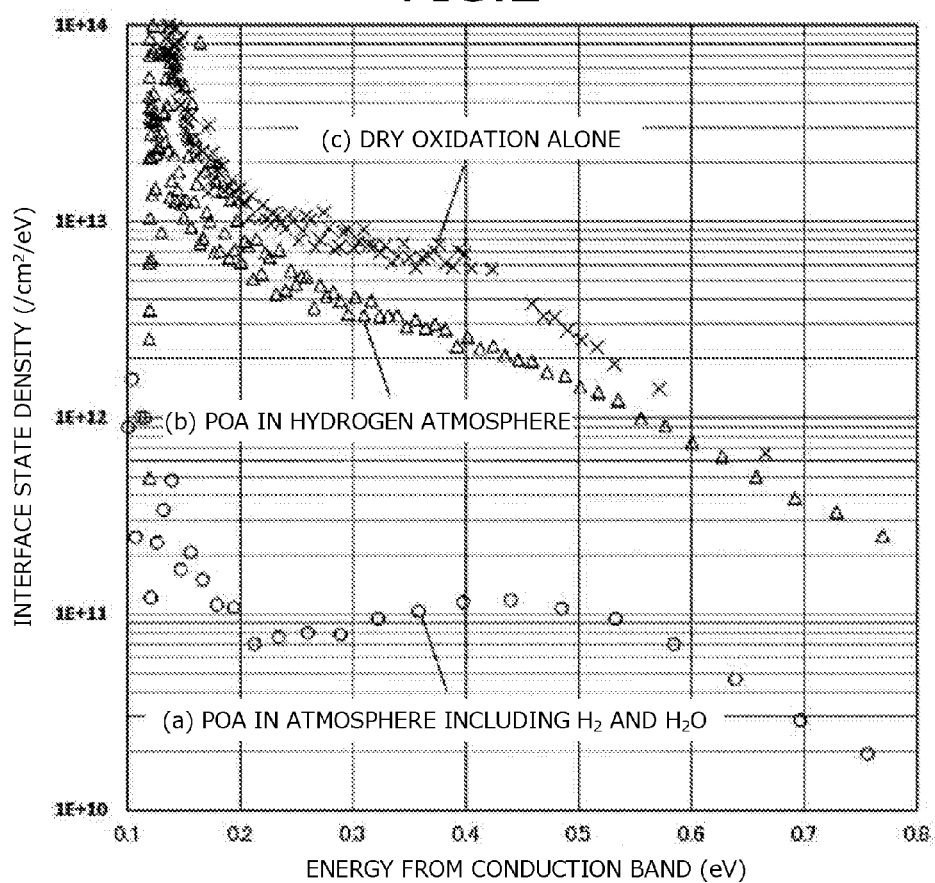
FIG. 2 is a graph depicting the interface state density obtained from measurement results respectively of a MOS capacitor according to the present invention and a MOS capacitor of a comparison example (first experiment example)

FIG. 2 depicts comparison results of the first experiment example. The POA (b) in the hydrogen atmosphere (plotted triangles) slightly lowered the interface state density compared to dry oxidation (c) alone where the POA of the third process was not performed (plotted×symbols). Compared to these results, the POA (a) in the atmosphere including $H_2$ and $H_2O$ of the present invention significantly lowered the interface state density.

Second Experiment Example

A second experiment example using MOS capacitors to verify the extent to which interface density is lowered by a condition of the atmosphere including $H_2$ and $H_2O$ will be described. MOS capacitors were produced where in the third process, the temperature of the POA in the atmosphere including $H_2$ and $H_2O$ was 800 degrees C., 900 degrees C., and 1000 degrees C., respectively.

Figure 3:
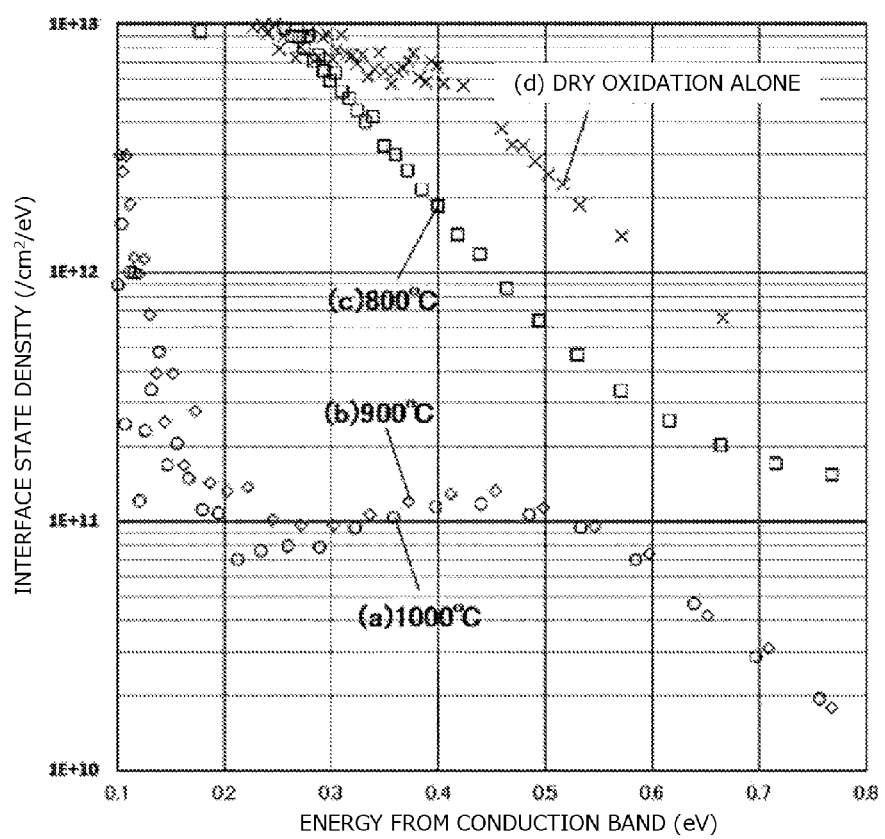
FIG. 3 is a graph depicting the interface state density obtained from measurement results respectively of the MOS capacitor according to the present invention and a MOS capacitor of comparison example (second experiment example)

FIG. 3 depicts comparison results of the second experiment example. The POA (c) in the atmosphere including $H_2$ and $H_2O$ at 800 degrees C. in the third process (plotted squares) slightly lowered the interface state density compared to dry oxidation (d) alone where the POA of the third process was not performed (plotted×symbols). Compared to these results (d) and (c), the POA in the atmosphere including $H_2$ and $H_2O$ and performed at 1000 degrees C. (a) and 900 degrees C. (b) in the third process significantly lowered the interface state density.

Based on the results above, in the POA in the atmosphere including $H_2$ and $H_2O$ in the third process, the temperature to efficiently terminate unsaturated bonds of silicon atoms on the silicon carbide substrate surface forming the interface state by hydrogen or hydroxyl groups is preferably 800 degrees C. or more. The temperature in the third process is more preferably 900 degrees C. or more, which significantly reduces the interface state density. Further, the temperature in the third process is 1200 degrees C. less to prevent desorption of terminated hydrogen or hydroxyl groups.

Third Experiment Example

MOS capacitors were produced adjusting the flow ratio of $H_2$ and $O_2$ in the third process and setting the concentration of $H_2O$ in the atmosphere to 1%, 7%, 67%, and 73%, respectively.

Figure 4:
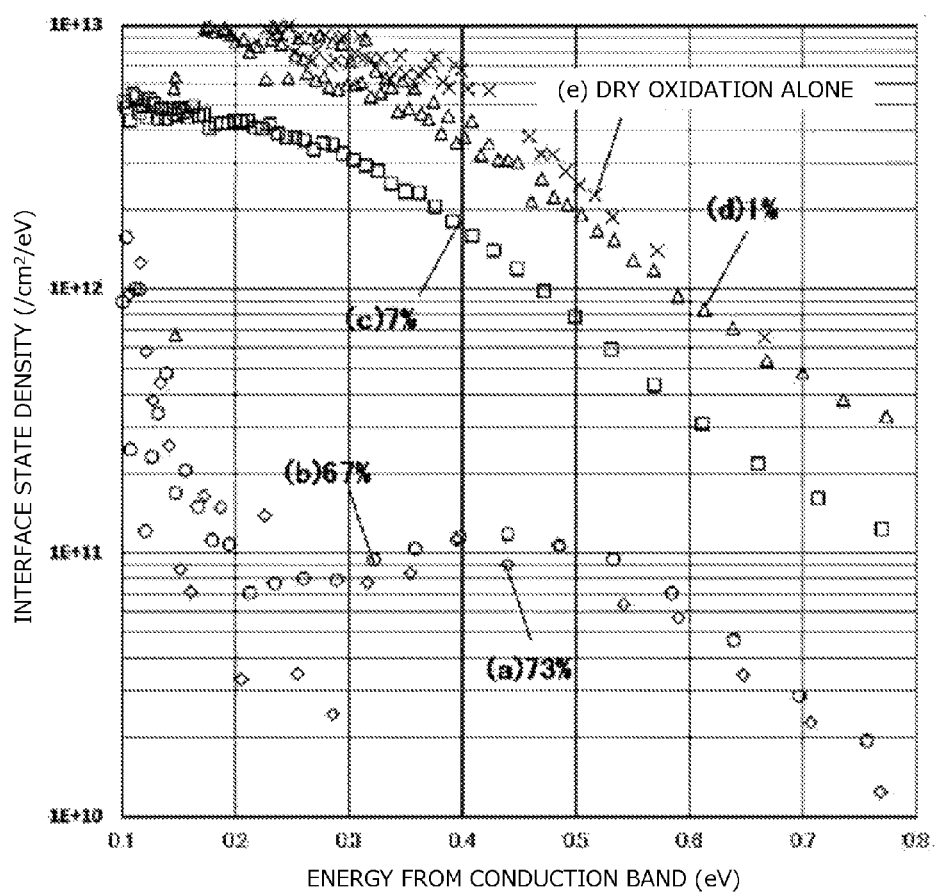
FIG. 4 is a graph depicting the interface state density obtained from measurement results respectively of the MOS capacitor according to the present invention and a MOS capacitor of comparison example (third experiment example)

FIG. 4 depicts comparison results of the third experiment example. The $H_2O$ concentration of 1% (d) in the atmosphere including $H_2$ and $H_2O$ in third process (plotted triangles) slightly lowered the interface state density compared to dry oxidation (e) alone where the POA in the atmosphere including $H_2$ and $H_2O$ in the third process was not performed (plotted×symbols). The $H_2O$ concentration of 7% (c) (plotted squares) further lowered the interface state density; and the $H_2O$ concentrations of 73% (a) and 67% (b) in the atmosphere including $H_2$ and $H_2O$ in the third process significantly lowered the interface state density.

Based on the results above, the $H_2O$ concentration in the atmosphere including $H_2O$ and $H_2$ is preferably 1% or more, and more preferably 7% or more. The $H_2O$ concentration, having no upper limit constraints, suffices to be 100% or less.

Fourth Experiment Example

MOS capacitors were produced setting the processing time of the POA in the atmosphere including $H_2$ and $H_2O$ in the third process to be 5 minutes, 30 minutes, and 180 minutes, respectively.

Figure 5:
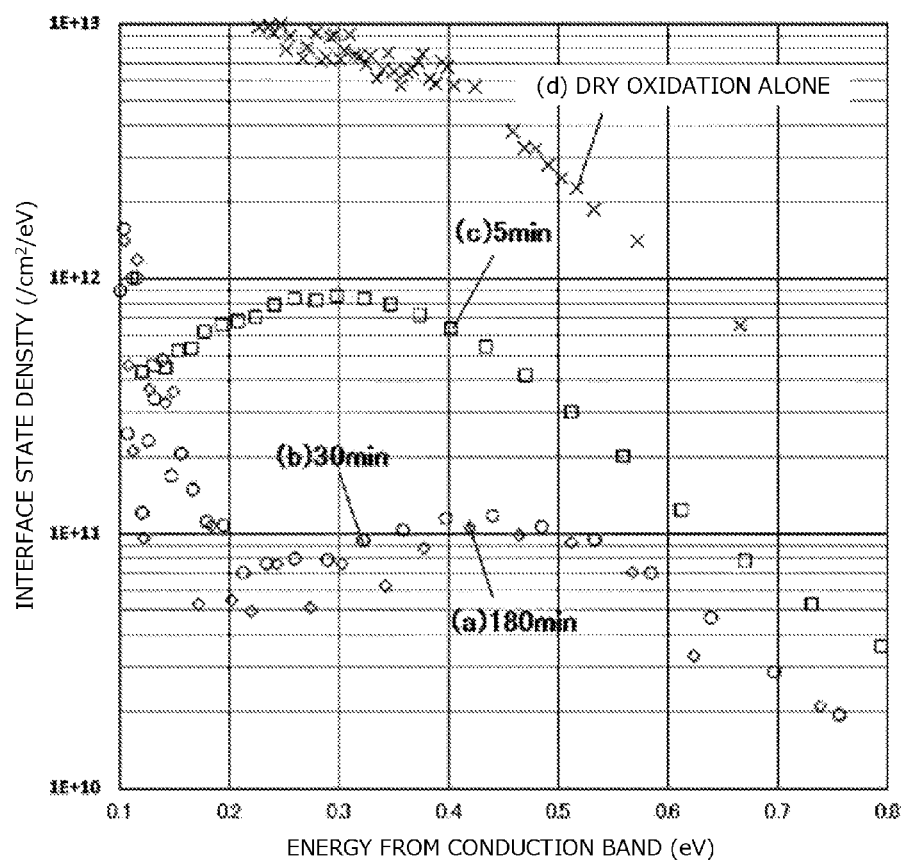
FIG. 5 is a graph depicting the interface state density obtained from measurement results respectively of the MOS capacitor according to the present invention and a MOS capacitor of comparison example (fourth experiment example)

FIG. 5 depicts comparison results of the fourth experiment example. The POA (c) performed for a processing time of 5 minutes in the atmosphere including $H_2$ and $H_2O$ in the third process (plotted squares) slightly lowered the interface state density compared to dry oxidation (d) alone where the POA of the third process was not performed (plotted× symbols). Compared to these results, the POA performed for the processing times of 180 minutes (a) and 30 minutes (b) in the atmosphere including $H_2$ and $H_2O$ in the third process significantly lowered the interface state density.

Based on the results above, the processing time suffices to be determined according to the $H_2O$ concentration in $H_2O+H_2$ and processing temperature such that unsaturated bonds of silicon atoms on the silicon carbide substrate surface forming the interface state are sufficiently terminated by hydroxyl groups or hydrogen. At the processing temperature and $H_2O$ concentration of the third process, the processing time is preferably 5 minutes or longer, and more preferably is 30 minutes or longer whereby the interface state density is significantly lowered.

As described with the first to fourth experiment examples, the interface state density varies greatly depending on conditions and whether the POA in the atmosphere including $H_2$ and $H_2O$ in the third process is performed and it was confirmed that the interface state density can be significantly reduced by the POA in the atmosphere including $H_2$ and $H_2O$.

Measurement results obtained by secondary ion mass spectroscopy (SIMS) are given for the hydrogen concentration near the $SiO_2/SiC$ interface where the interface state density was lowered significantly by the POA in the atmosphere including $H_2$ and $H_2O$ described in the present invention. In the SIMS analysis, hydrogen (H) and hydroxyl groups (OH) cannot be differentiated and therefore, in the hydrogen concentration, hydrogen atoms from both hydrogen (H) and hydroxyl groups (OH) are included.

Figure 6:
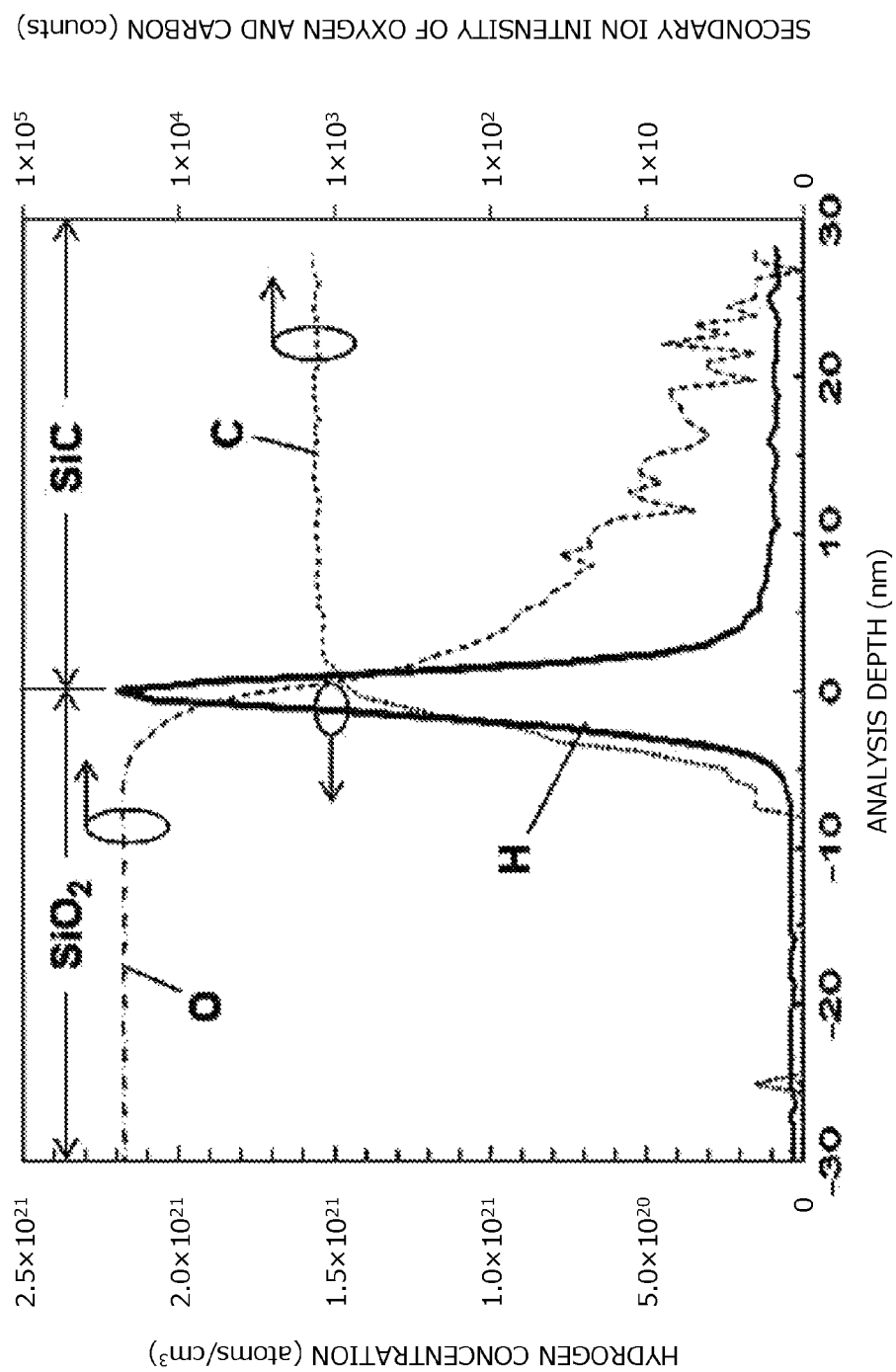
FIG. 6 is a chart depicting hydrogen concentration measurement results obtained by secondary ion mass spectroscopy near a $SiO_2$/SiC interface in a semiconductor device of the present invention.

FIG. 6 is a chart depicting hydrogen concentration measurement results obtained by secondary ion mass spectroscopy near the $SiO_2/SiC$ interface in a semiconductor device of the present invention. FIG. 6 depicts SIMS analysis results for a $SiO_2$ film formed by performing according to the second and third processes above, dry oxidation and the POA in the atmosphere including $H_2$ and $H_2O$ with respect to a SiC substrate having a (000-1) surface. The vertical axes represent hydrogen concentration and secondary ion intensity of oxygen and carbon. The horizontal axis represents analysis depth where the peak position of hydrogen concentration is 0. Cesium (Cs) was used as a primary ion species of the SIMS.

The left side of FIG. 6 represents $SiO_2$, where the secondary ion intensity O is high, while the right side represents SiC, where the secondary ion intensity C is high. The concentration H at the $SiO_2/SiC$ interface has a steep concentration peak of $1\times10^{21}$ atoms/cm³ or more. The half-width of the peak is about 3 nm and the presence of hydrogen or hydroxyl groups in a limited region including $SiO_2/SiC$ interface was confirmed.

It is favorable for the hydrogen or hydroxyl groups terminating the unsaturated bonds of silicon atoms of the silicon carbide substrate surface forming the interface state to be segregated to only the $SiO_2/SiC$ interface (MOS interface), where a range of 0.5 nm to 10 nm including the $SiO_2/SiC$ interface is preferable. More preferably, the range is 0.5 nm to 5 nm because when the hydrogen or hydroxyl groups are present in a range exceeding 10 nm, hydrogen and hydroxyl groups that do not contribute to the termination of unsaturated bonds of silicon atoms on the silicon carbide substrate surface forming the interface state increase and cause electron traps. Further, when the region where the hydrogen or hydroxyl groups are segregated is less than 0.5 nm, sufficient termination of the unsaturated bonds of silicon atoms on the silicon carbide substrate surface forming the interface state is not possible, making the formation of a stable $SiO_2/SiC$ interface impossible.

In the region including the $SiO_2/SiC$ interface and to which the hydrogen or hydroxyl groups are segregated, $1\times10^{21}$ atoms/cm³ to $1\times10^{22}$ atoms/cm³ of hydrogen or hydroxyl groups is preferable. The reason for this is that with less than $1\times10^{21}$ atoms/cm³, termination of the interface state cannot be performed sufficiently and with more than $1\times10^{22}$ atoms/cm³, the quality of the oxide film degrades consequent to the excess hydrogen.

First Embodiment

Figure 7:
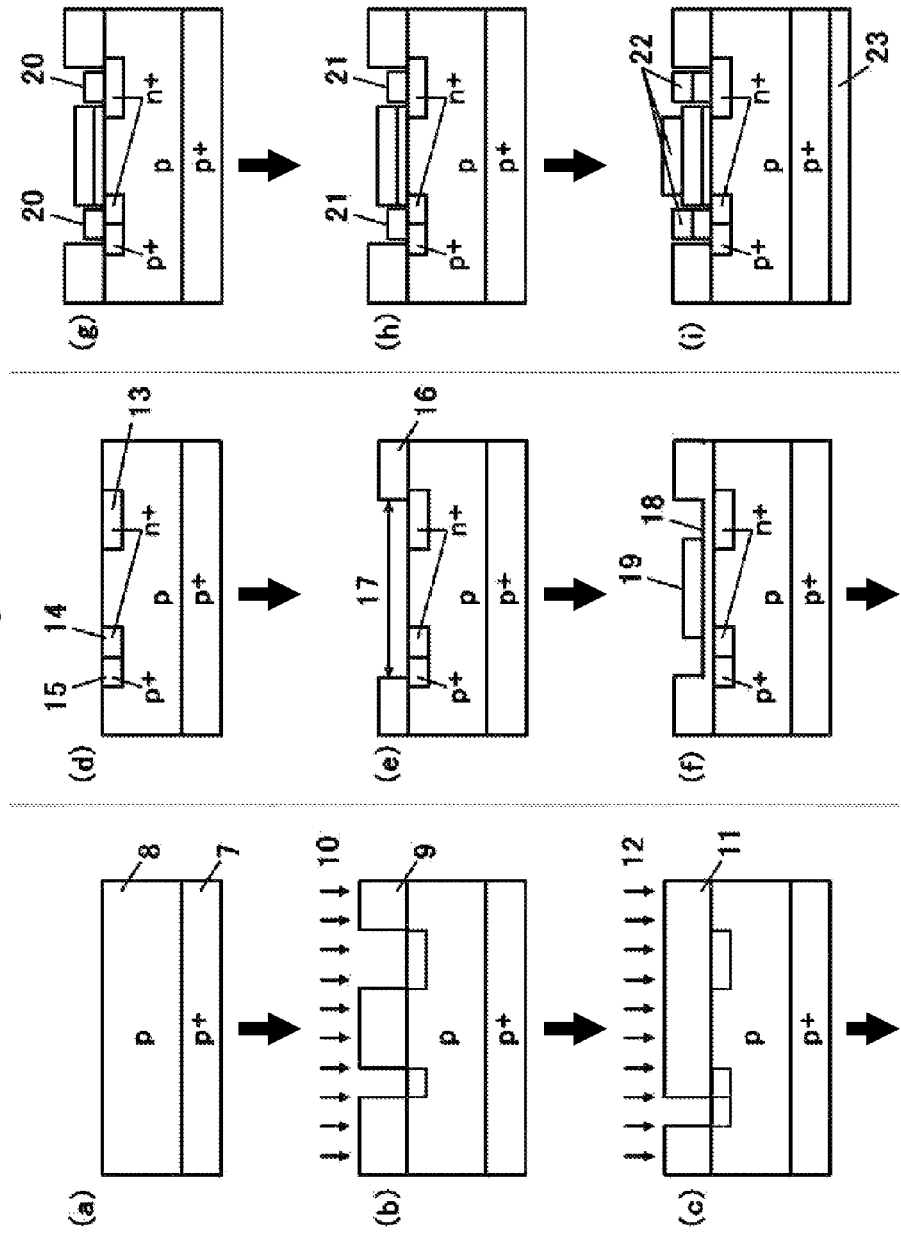
FIG. 7 is cross-sectional views for describing MOSFET manufacturing processes of the present invention.

A first embodiment of the present invention will be described. FIG. 7 is cross-sectional views for describing MOSFET manufacturing processes of the present invention. At (a) to (i) in FIG. 7, the first to ninth processes performed when the MOSFET is fabricated on a silicon carbide (000-1) surface, according to the present embodiment are depicted.

(1) First Process

As depicted at (a) in FIG. 7, on a p-type 4H—SiC (000-1) substrate 7 (a substrate 0 to 8 degrees off from a (000-1) surface, and preferably, a substrate 0 to 4 degrees off), a p-type epitaxial film 8 of an acceptor concentration of $1\times10^{16}$ cm⁻³ is grown.

(2) Second Process

As depicted at (b) in FIG. 7, on the surface of the p-type epitaxial film 8, a $SiO_2$ film having a thickness of 1 μm is deposited by a low pressure CVD method, patterning by photolithography is performed, and a mask 9 is formed. Thereafter, for example, using the mask 9, phosphorus ions 10 are implanted at a substrate temperature of 500 degrees C., in multi-stages of acceleration energy ranging from 40 keV to 250 keV, and at a dose of $2\times10^{20}$ cm⁻³.

(3) Third Process

As depicted at (c) in FIG. 7, the mask 9 is removed, and on the surface, a $SiO_2$ film having a thickness of 1 μm is deposited by a low pressure CVD method, patterning by photolithography is performed, and a mask 11 is formed. Thereafter, for example, using the mask 11, aluminum ions 12 are implanted at a substrate temperature of 500 degrees C., in multi-stages of acceleration energy ranging from 40 keV to 200 keV, and at a dose of $2\times10^{20}$ cm⁻³.

(4) Fourth Process

As depicted at (d) in FIG. 7, the mask 11 is removed, activation annealing is performed for 5 minutes at 1600 degrees C. in an argon atmosphere, and a drain region 13, a source region 14, and a ground region 15 are formed.

(5) Fifth Process

As depicted at (e) in FIG. 7, a field oxide film 16 having a thickness of 0.5 μm is deposited by a low pressure CVD method, a portion of the field oxide film 16 is removed by photolithography and wet etching, and an active region 17 is formed.

(6) Sixth Process

As depicted at (f) in FIG. 7, dry oxidation is performed for 50 minutes at 1100 degrees C. in a dry oxygen atmosphere, and a gate insulating film 18 having a thickness of 50 nm is formed. As the POA, heat treatment is performed for 30 minutes at 1000 degrees C. in an atmosphere including $H_2$ and $H_2O$. The $H_2O$ concentration in the $H_2O$ and $H_2$ atmosphere is set to be 73% and the flow ratio of $H_2$ to $O_2$ is adjusted. Heating is performed in a nitrogen atmosphere while cooling is performed in a hydrogen atmosphere, and before cooling, a hydrogen atmosphere is maintained for 30 minutes. Thereafter, on the gate insulating film 18, polycrystalline silicon is deposited to a thickness of 0.3 μm by a low pressure CVD method, patterning by photolithography is performed, and a gate electrode 19 is formed.

(7) Seventh Process

As depicted at (g) in FIG. 7, on the drain region 13, the source region 14, and the ground region 15, a contact hole is formed by photolithography and hydrofluoric acid etching; and from the top thereof, aluminum of a thickness of 10 nm and further nickel of a thickness of 60 nm are vapor deposited, patterning by liftoff is performed, and contact metal 20 is formed.

(8) Eighth Process

As depicted at (h) in FIG. 7, as ohmic contact annealing, annealing is performed in an atmosphere of inert gas or a mixture of inert gas and hydrogen held at 950 degrees C. for 2 minutes, and a reaction layer (electrical contact portion) 21 of the contact metal 20 and silicon carbide is formed. The inert gas is any among nitrogen, helium, and argon.

(9) Ninth Process

As depicted at (i) in FIG. 7, aluminum of 300 nm is vapor deposited on the surface, a pad electrode 22 is formed respectively on the gate electrode 19 and the respective reaction layers 21 by photolithography and phosphoric acid etching, aluminum of 100 nm is vapor deposited on the back surface, and a back surface electrode 23 is formed.

Evaluation of the characteristics of the silicon carbide MOSFET manufactured by the silicon carbide MOSFET manufacturing method depicted in FIG. 7 indicated channel mobility to be a high value of about 75 $cm^2/Vs$.

Comparison Example

A silicon carbide MOSFET was produced by the same manufacturing method as in the first embodiment, except that in the sixth process above, the POA in the atmosphere including $H_2$ and $H_2O$ was not performed. Evaluation of the characteristics indicated channel mobility to be a low value of about 18 $cm^2/Vs$.

Second Embodiment

A silicon carbide MOSFET was produced by the same manufacturing method as in the first embodiment, except that in the POA in the atmosphere including $H_2$ and $H_2O$ in the sixth process, the heating and cooling were performed in a hydrogen atmosphere. Characteristics identical to those in the first embodiment were found.

Third Embodiment

A silicon carbide MOSFET was produced by the same manufacturing method as in the first embodiment, except that in the sixth process, as a second POA after the POA in the atmosphere including $H_2$ and $H_2O$, 30-minute heat treatment at 900 degrees C. in a hydrogen atmosphere was performed. Channel mobility was indicated to be a high value of about 77 $cm^2/Vs$.

Fourth Embodiment

A silicon carbide MOSFET was produced by the same manufacturing method as in the first embodiment, except that in the sixth process, as a second POA after the POA in the atmosphere including $H_2$ and $H_2O$, 30-minute heat treatment at 900 degrees C. in a nitrogen atmosphere was performed. Although channel mobility was indicated to be a value lower than that in the first embodiment (about 40 $cm^2/Vs$), channel mobility was higher than in the comparison example.

Fifth Embodiment

A silicon carbide MOSFET was produced by the same manufacturing method as in the first embodiment, except that in the sixth process, the method of forming the gate insulating film 18 was thermal oxynitriding for 120 minutes at 1300 degrees C. in an atmosphere having a nitrous oxide to nitrogen flow ratio of 1:5. Characteristics identical to those in the first embodiment were found.

Sixth Embodiment

A silicon carbide MOSFET was produced by the same manufacturing method as in the first embodiment, except that in the sixth process, the method of forming the gate insulating film 18 was thermal oxynitriding for 90 minutes at 1250 degrees C. in a nitric oxide atmosphere. Characteristics identical to those in the first embodiment were found.

Seventh Embodiment

A silicon carbide MOSFET was produced by the same manufacturing method as in the first embodiment, except that in the sixth process, the method of forming the gate insulating film 18 was 30-minute heat treatment at 1000 degrees C. in an atmosphere including oxygen and water by a pyrogenic scheme. Characteristics identical to those in the first embodiment were found.

Eighth Embodiment

A silicon carbide MOSFET was produced by the same manufacturing method as in the first embodiment, except that in the sixth process, the method of forming the gate insulating film 18 included forming a deposited film by a CVD method using silane. Characteristics identical to those in first embodiment were found.

In the embodiments above, although the crystalline structure used was a 4H—SiC (000-1) substrate (substrate 0 to 8 degrees off), when the crystalline structure is a 4H—SiC (0001) substrate or (11-20) substrate, the same effects can be obtained.

Thus, according to the present invention, independent of the method by which the gate insulating film is formed, by performing POA in an atmosphere that includes $H_2$ and $H_2O$ without including $O_2$ after the gate insulating film is formed, hydrogen or hydroxyl groups can be segregated to a limited region that includes the interface of the silicon carbide substrate and gate insulating film, enabling the interface state density to be lowered and high channel mobility to be realized.

In described above, the manufacturing method of the silicon carbide semiconductor device according to the present invention has been described taking an example of a manufacturing method of a horizontal MOSFET that uses a p+-type semiconductor substrate and that is manufactured as a silicon carbide MOSFET. Nonetheless, the invention is not limited hereto and is applicable to semiconductor devices having high breakdown voltage structures such as vertical MOSFETs using an n+-type semiconductor substrate, etc. and semiconductor devices having complicated MOS gate structures and trench gates, achieving the same effects. Therefore, without departing from the invention described within the scope of the claims, the present invention is applicable to manufacturing methods of various types of semiconductor devices. The present invention is further applicable in cases where the conductivity types (n-type, p-type) of the semiconductor layer or the semiconductor region are inverter.

Figure 8:
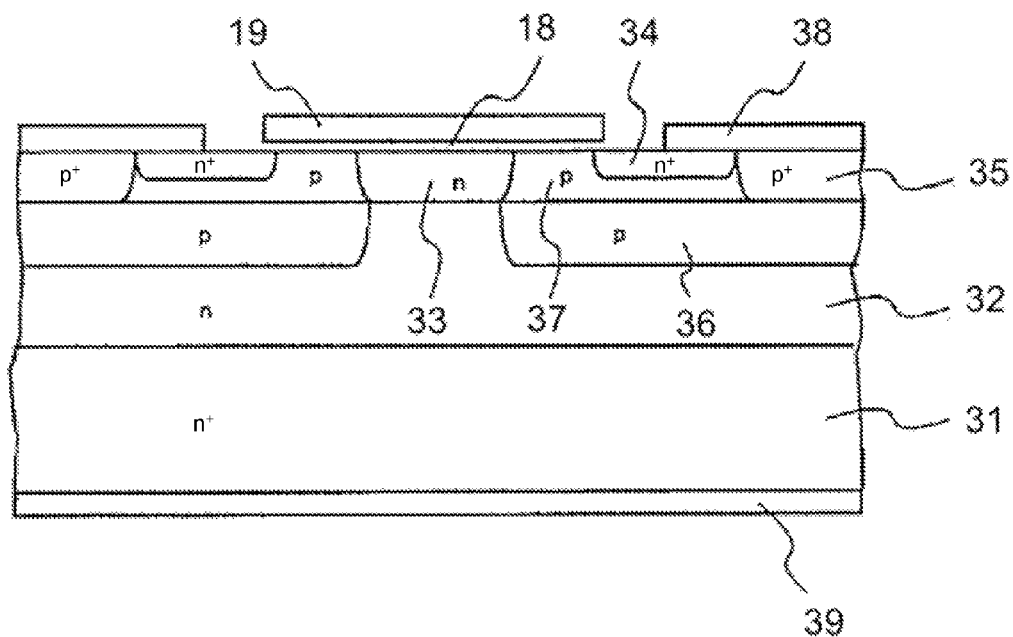
FIG. 8 is a diagram depicting one example of a semiconductor device having the complicated MOS gate structure according to the present invention.

A complicated MOS gate structure, for example, is a device structure forming a channel near the surface of a SiC epitaxial substrate during the ON state. FIG. 8 is a diagram depicting one example of a semiconductor device having the complicated MOS gate structure according to the present invention. As depicted in the cross section view in FIG. 8, in a vertical MOSFET, on a front surface of an n+-type silicon carbide substrate 31, an n-type epitaxial layer 32 is formed. The impurity concentration of the n-type epitaxial layer 32 is lower than the impurity concentration of the n+-type silicon carbide substrate 31. Inside the n-type epitaxial layer 32, plural p-type regions 36 are selectively formed. The p-type regions 36 have a surface that is exposed (the surface on the opposite side with respect to the n+-type silicon carbide substrate 31 side of the n-type epitaxial layer 32). A p-type SiC layer 37 of a lower concentration than the p-type regions 36 is formed covering a front surface of the p-type regions 36 and the n-type epitaxial layer 32. In the p-type SiC layer 37 on the n-type epitaxial layer 32 where the p-type regions 36 are not formed, an n-type region 33 is formed that in a depth direction, penetrates the p-type SiC layer 37, reaching the n-type epitaxial layer 32. The n-type epitaxial layer 32 and the n-type region 33 are an n-type drift region. The impurity concentration of the n-type region 33 is preferably higher than that of the n-type epitaxial layer 32.

In the p-type SiC layer 37, an n+-type source region 34 and a p+-type contact region 35 are formed to abut one another. The n+-type source region 34 and the p+-type contact region 35 have a surface that is exposed (the surface on the opposite side with respect to the p-type regions 36 side of the p-type SiC layer 37). The n+-type source region 34 is formed away from the n-type region 33. The p+-type contact region 35 is positioned opposing the n+-type source region 34, on the opposite side thereof with respect to the n-type region 33 side of the n+-type source region 34. The impurity concentration of the p+-type contact region 35 is higher than the impurity concentration of the p-type SiC layer 37. Portions excluding the n-type region 33, the p+-type contact region 35, and the n+-type source region 34 of the p-type SiC layer 37, form a p-type base region together with the p-type regions 36. In the front surface of the n+-type source region 34 and the p+-type contact region 35, a source electrode 38 is formed. In the front surface of the p-type SiC layer 37 and the n-type region 33 between adjacent n+-type source regions 34, the gate electrode 19 is formed through the gate insulating film 18. The gate electrode 19 is electrically insulated from the source electrode 38 by a non-depicted interlayer insulating film. Further, in the back surface of the n+-type silicon carbide substrate 31, a drain electrode 39 that abuts the n+-type silicon carbide substrate 31 is formed.

With the configuration described, the atmosphere of the heat treatment after the gate insulating film is formed is an atmosphere that includes H2 and H2O without including O2, enabling hydrogen or hydroxyl groups to be segregated in a limited region that includes the interface of the silicon carbide substrate and the gate insulating film, the interface state density to be lowered, and high channel mobility to be achieved.

According to the present invention, an effect is achieve in that the interface state density of a (000-1) surface or a (11-20) surface of a silicon carbide semiconductor can be reduced more effectively.

As described above, the silicon carbide semiconductor device and the manufacturing method of the silicon carbide semiconductor device according to the present invention, for example, are useful for power silicon carbide semiconductor devices such as power devices, and power silicon carbide semiconductor devices used for industrial motor control, engine control, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, comprising:
   providing a silicon carbide semiconductor substrate;
   forming a gate insulating film on the silicon carbide semiconductor substrate that is at least one layer comprised of one of an oxide film, a nitride film, and an oxynitride film; and
   heat treating after the forming the gate insulating film, in an atmosphere that includes hydrogen ($H_2$) gas and water vapor ($H_2O$) at a same time without including dry oxygen ($O_2$) gas.

2. The manufacturing method according to claim 1, further comprising cooling after the heat treating, wherein the atmosphere during at least one of heating in the heat treating and the cooling after the heat treating is one of hydrogen ($H_2$) gas and diluted hydrogen ($H_2$) gas.

3. The manufacturing method according to claim 1, further comprising
   cooling after the heat treating, and
   before the cooling after the heat treating, switching the atmosphere to one of hydrogen ($H_2$) gas and diluted hydrogen ($H_2$) gas and maintaining the switched atmosphere for a predetermined period of time.

4. The manufacturing method according to claim 1, further comprising heat treating at a predetermined temperature in an atmosphere of one of hydrogen ($H_2$) gas and diluted hydrogen ($H_2$) gas, after the heat treating after the forming the gate insulating film.

5. The manufacturing method according to claim 1, further comprising, after the heat treating after the forming the gate insulating film, heat treating at a predetermined temperature in an inert gas atmosphere comprised of at least one of nitrogen, helium, and argon.

6. The manufacturing method according to claim 1, further comprising, including a gas that includes oxygen ($O_2$) without including water vapor ($H_2O$) so that thermal oxidation takes place during the forming the gate insulating film.

7. The manufacturing method according to claim 1, further comprising, during the forming the gate insulating film, thermal oxynitriding in a gas atmosphere that includes at least one of nitrous oxide and nitric oxide.

8. The manufacturing method according to claim 1, wherein the forming the gate insulating film includes thermal oxidizing the semiconductor substrate in a gas atmosphere that includes at least oxygen ($O_2$) and water vapor ($H_2O$).

9. The manufacturing method according to claim 1, wherein, during the forming the gate insulating film, depositing an insulating film comprised of one of an oxide film, a nitride film, and an oxynitride film.

10. The manufacturing method according to claim 1, wherein the gate insulating film is formed on a (000-1) surface or a (11-20) surface of the silicon carbide semiconductor substrate.

11. A method of manufacturing a silicon carbide semiconductor device, comprising:
   providing a silicon carbide semiconductor substrate;
   forming a gate insulating film including oxide on the silicon carbide semiconductor substrate in an atmosphere that includes dry oxygen ($O_2$) gas;
   performing a first heat treatment after the forming the gate insulating film, in a first atmosphere that includes hydrogen ($H_2$) gas and water vapor ($H_2O$) without including dry oxygen ($O_2$) gas, and maintaining at a temperature equal to or higher than 900 degree for a predetermined period of time; and
   performing a second heat treatment after the first heat treatment, in a second atmosphere that includes hydrogen ($H_2$) gas, at a temperature equal to or higher than 900 degree.

12. The manufacturing method according to claim 11, wherein during the first heat treatment, the predetermined period maintaining the temperature equal to or higher than 900 degree is equal to or greater than 30 minutes.

13. The manufacturing method according to claim 11, wherein during the first heat treatment, a concentration of the water vapor ($H_2O$) in the first atmosphere is equal to or higher than 7%.

14. The manufacturing method according to claim 11, wherein during the first heat treatment, a concentration of the water vapor ($H_2O$) in the first atmosphere is equal to or higher than 67%.

15. The manufacturing method according to claim 12, wherein during the first heat treatment, a concentration of the water vapor ($H_2O$) in the first atmosphere is equal to or higher than 67%.

16. The manufacturing method according to claim 11, further comprising performing cooling treatment after the second heat treatment in a third atmosphere that is one of hydrogen ($H_2$) gas and diluted hydrogen ($H_2$) gas.

17. The manufacturing method according to claim 11, wherein during the second heat treatment, the temperature equal to or higher than 900 degree is maintained for a predetermined period of time.

18. The manufacturing method according to claim 11, wherein the forming the gate insulating film includes thermal oxidizing the semiconductor substrate in a gas atmosphere that includes at least oxygen ($O_2$) and water vapor ($H_2O$).

19. The manufacturing method according to claim 11, wherein the forming the gate insulating film includes depositing an insulating film comprised of one of an oxide film, a nitride film, and an oxynitride film.

20. The manufacturing method according to claim 11, wherein the gate insulating film is formed on a (000-1) surface or a (11-20) surface of the silicon carbide semiconductor substrate.

* * * * *